United States Patent
Seo

(10) Patent No.: US 11,626,040 B2
(45) Date of Patent: Apr. 11, 2023

(54) FLEXIBLE PRINTED CIRCUIT FILM, DISPLAY APPARATUS AND METHOD OF MANUFACTURING THE SAME

(71) Applicant: Samsung Display Co., LTD., Yongin-si (KR)

(72) Inventor: Eun Won Seo, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 32 days.

(21) Appl. No.: 17/113,809

(22) Filed: Dec. 7, 2020

(65) Prior Publication Data

US 2021/0264821 A1 Aug. 26, 2021

(30) Foreign Application Priority Data

Feb. 21, 2020 (KR) .................. 10-2020-0021437

(51) Int. Cl.
*H05K 1/18* (2006.01)
*G09F 9/30* (2006.01)

(52) U.S. Cl.
CPC ............. *G09F 9/301* (2013.01); *H05K 1/189* (2013.01); *H05K 2201/10128* (2013.01)

(58) Field of Classification Search
CPC .................... G09F 9/301; H05K 1/189; H05K 2201/10128
USPC ...................................................... 361/679.01
See application file for complete search history.

(56) References Cited

U.S. PATENT DOCUMENTS

| 9,414,504 B2 * | 8/2016 | Joo ...................... G02B 6/0083 |
| 2020/0192431 A1 * | 6/2020 | Shin ...................... G06F 1/1656 |
| 2020/0323584 A1 * | 10/2020 | Daly ...................... H05K 1/118 |

* cited by examiner

*Primary Examiner* — Binh B Tran
(74) *Attorney, Agent, or Firm* — Kile Park Reed & Houtteman PLLC

(57) ABSTRACT

A display apparatus includes a display panel that displays an image, a first flexible printed circuit film disposed on a rear surface of the display panel, and a cover window disposed on the display panel. The first flexible printed circuit film includes a first horizontal portion electrically connected to the display panel and extending in a first direction, a first vertical portion electrically connected to the first horizontal portion and extending in a second direction intersecting the first direction, and a protruding portion that protrudes from a side surface of the first vertical portion.

23 Claims, 12 Drawing Sheets

FLEXIBLE PRINTED CIRCUIT FILM, DISPLAY APPARATUS AND METHOD OF MANUFACTURING THE SAME

CROSS-REFERENCE TO RELATED APPLICATION(S)

This application claims priority to and benefits of Korean Patent Application No. 10-2020-0021437 under 35 USC § 119 filed on Feb. 21, 2020 in the Korean Intellectual Property Office, the entire contents of which are incorporated herein by reference.

BACKGROUND

1. Technical Field

The disclosure relates to a flexible printed circuit film, a display apparatus, and a method of manufacturing the display apparatus, and, to a flexible printed circuit film including a stiffener, a display apparatus with improved assembly quality, and a method of manufacturing the display apparatus.

2. Description of the Related Art

Recently, as technology improves, display products having smaller sizes, being lighter in weight, and having superior performance have been produced. Conventional cathode ray tube (CRT) televisions have been widely used for display apparatuses with many advantages in terms of performance and price. Recently, however, a display apparatus such as a plasma display apparatus, a liquid crystal display apparatus, and an organic light emitting diode display apparatus that overcomes weaknesses of the CRT in terms of miniaturization and/or portability and has advantages such as miniaturization, being light weight, and having low power consumption has been spotlighted.

A display panel, which may display an image, and a driving circuit for driving the display panel or a flexible printed circuit (FPC) film electrically connected to a peripheral electronic device may be attached to the display apparatus. As the flexible printed circuit film becomes thinner and longer, the assembly quality may deteriorate due to misalignment of an attachment position.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display apparatus with improved assembly quality.

Embodiments provide a method of manufacturing the display apparatus.

Embodiments provide a flexible printed circuit film that may be used for manufacturing the display apparatus.

According to an embodiment, a display apparatus may include a display panel that displays an image, a first flexible printed circuit film disposed on a rear surface of the display panel, and a cover window disposed on the display panel. The first flexible printed circuit film may include a first horizontal portion electrically connected to the display panel and extending in a first direction, a first vertical portion electrically connected to the first horizontal portion and extending in a second direction intersecting the first direction, and a protruding portion that protrudes from a side surface of the first vertical portion.

In an embodiment, the protruding portion may protrude toward an edge of the cover window in parallel with the first direction.

In an embodiment, the first vertical portion of the first flexible printed circuit film may have a first thickness. The protruding portion may have an end which is adjacent to the edge of the cover window and has a second thickness. The second thickness may be smaller than the first thickness.

In an embodiment, the first flexible printed circuit film may include an output portion connected to the first horizontal portion. The display panel may include a display portion and an input portion extending from the display portion. The output portion of the first flexible printed circuit film may be electrically connected to the input portion of the display panel by an anisotropic conductive film.

In an embodiment, the first flexible printed circuit film may include a connection portion connected to the first vertical portion and including a connector terminal.

In an embodiment, the display apparatus may further include an adhesive layer disposed between the first horizontal portion and the display panel.

In an embodiment, the display apparatus may further include a second flexible printed circuit film disposed on the rear surface of the display panel. The second flexible printed circuit film may include a second horizontal portion electrically connected to the display panel and extending in the first direction; and a second vertical portion connected to the second horizontal portion and extending in the second direction.

In an embodiment, the second flexible printed circuit film may include a protruding portion that protrudes from a side surface of the second vertical portion.

In an embodiment, the first flexible printed circuit film may at least partially overlap the second flexible printed circuit film.

In an embodiment, the second flexible printed circuit film may include a folding portion bonded to the display panel.

In an embodiment, a length of the first vertical portion of the first flexible printed circuit film may be longer than a length of the first horizontal portion of the first flexible printed circuit film.

According to an embodiment, a method of manufacturing a display apparatus may include partially bonding a first flexible printed circuit film to a display panel, wherein the first flexible printed circuit film may include a first horizontal portion extending in a first direction, a first vertical portion connected to the first horizontal portion and extending in a second direction, and a first stiffener connected to the first vertical portion. The method may include arranging the first flexible printed circuit film on a rear surface of the display panel such that a side surface of the first stiffener contacts a jig. The method may include removing the first stiffener of the first flexible printed circuit film.

In an embodiment, the display panel may include a display portion and an input portion extending from the display portion. The arranging of the first flexible printed circuit film may include bending the input portion of the display panel.

In an embodiment, the partially bonding of the first flexible printed circuit film to the display panel may include electrically connecting the first flexible printed circuit film to the display panel by an anisotropic conductive film.

In an embodiment, the arranging of the first flexible printed circuit film on the rear surface of the display panel may include adhering an adhesive layer of the first vertical portion to the rear surface of the display panel.

In an embodiment, the method may further include attaching a cover film to the first flexible printed circuit film, the cover film including a handle portion spaced apart from the first flexible printed circuit film; and removing the cover film after the adhesive layer is adhered to the rear surface of the display panel.

In an embodiment, the method may further include connecting the first stiffener of the first flexible printed circuit film to the first vertical portion by a protruding portion that protrudes from a side surface of the first vertical portion, and forming a groove in the protruding portion, the groove extending in the second direction.

In an embodiment, the method may further include partially bonding a second flexible printed circuit film to the display panel after the first stiffener is removed, wherein the second flexible printed circuit film may include a second horizontal portion extending in the first direction, a second vertical portion connected to the second horizontal portion and extending in the second direction, and a second stiffener connected to the second vertical portion. The method may further include arranging the second flexible printed circuit film on the rear surface of the display panel such that a side surface of the second stiffener contacts the jig, and removing the second stiffener of the second flexible printed circuit film.

In an embodiment, the first stiffener of the first flexible printed circuit film and the second stiffener of the second flexible printed circuit film may have different widths in the first direction.

In an embodiment, the display panel may include a pixel structure that displays an image and a touch electrode. The partially bonding of the first flexible printed circuit film may include electrically connecting the first flexible printed circuit film to the pixel structure. The partially bonding of the second flexible printed circuit film may include electrically connecting the second flexible printed circuit film to the touch electrode.

According to an embodiment, a flexible printed circuit film may include a horizontal portion extending in a first direction, a vertical portion extending in a second direction intersecting the first direction, a protruding portion protruding from a side surface of the vertical portion, and a stiffener connected to the protruding portion and extending in the second direction.

In an embodiment, the vertical portion may be longer than the horizontal portion.

In an embodiment, the protruding portion may have a groove extending in the second direction.

In an embodiment, the flexible printed circuit film may further include a cover film detachably attached onto the vertical portion and the horizontal portion. The cover film may include a handle portion spaced apart from the vertical portion and the horizontal portion.

In an embodiment, the flexible printed circuit film may further include a connection portion connected to the vertical portion and including a connector terminal.

According to embodiments, a flexible printed circuit film bonded to a display panel may include a horizontal portion extending in a first direction, a vertical portion extending in a second direction intersecting the first direction, a protruding portion that protrudes from a side surface of the vertical portion, and a stiffener connected to the protruding portion and extending in the second direction.

Thus, when assembling the flexible printed circuit film with the display panel, a worker or machine or device may easily align an attachment position by using a jig and the stiffener connected to the protruding portion of the vertical portion. Accordingly, assembly quality may be prevented from deteriorating due to misalignment, and manufacturing efficiency may be improved.

However, effects of the embodiments are not limited to the above effects, and may be variously expanded without departing from the scope of the disclosure.

BRIEF DESCRIPTION OF THE DRAWINGS

Aspects of one or more embodiments will be more clearly understood from the following detailed description taken in conjunction with the accompanying drawings. In the drawings.

DETAILED DESCRIPTION OF THE EMBODIMENTS

Figure 1:
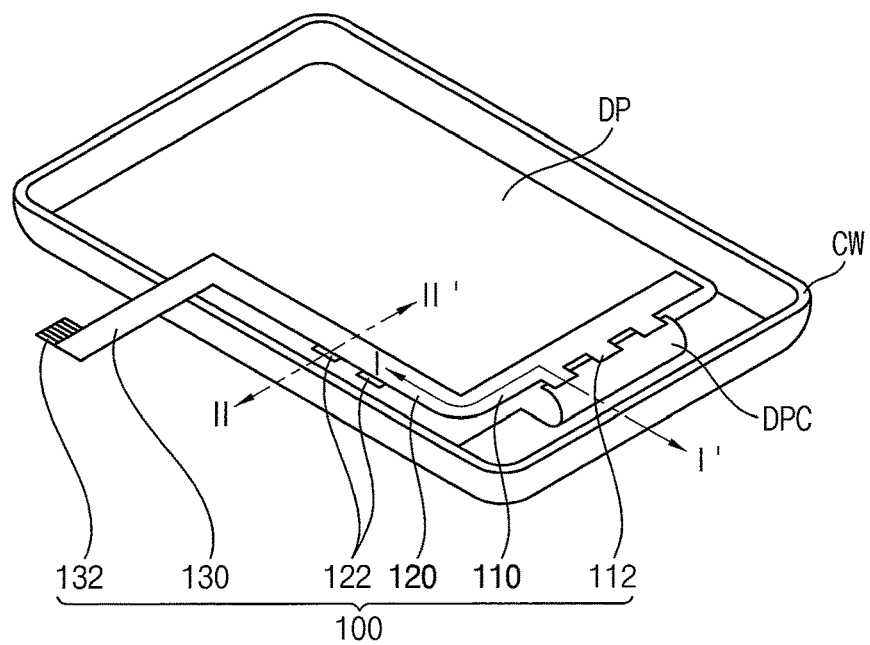
FIG. 1 is a perspective view showing a display apparatus according to an embodiment.
Figure 1:
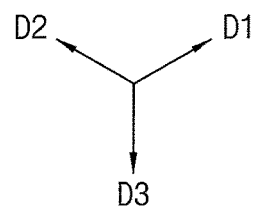

Hereinafter, embodiments will be described in more detail with reference to the drawings.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, embodiments will be illustrated in the drawings and described in detail in the written description. Effects and characteristics of the disclosure, and a method of accomplishing the same will become apparent and more readily appreciated from the following description of the embodiments and the accompanying drawings. However, the disclosure is not limited to the embodiments herein and may be implemented in various forms. Hereinafter, when description is made with reference to the drawings, like reference numerals are given to like or corresponding elements and repeated descriptions thereof are omitted.

It will be understood that although the terms "first," "second," etc. may be used herein to describe various components, these components should not be limited by these terms. These components are only used to distinguish one component from another. For instance, a first element or component discussed below could be termed a second element or component without departing from the teachings of the disclosure. Similarly, the second element or component could also be termed the first element or component.

As used herein, the singular forms "a," "an," and "the" are intended to include the plural forms as well, unless the context clearly indicates otherwise.

It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" to another layer, region, or component, it may be "directly electrically connected" to the other layer, region, or component and/or may be "indirectly electrically connected" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

As used herein, the term "unit" denotes a structure or element as illustrated in the drawings and as described in the specification. However, the disclosure is not limited thereto. The term "unit" is not to be limited to that which is illustrated in the drawings.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
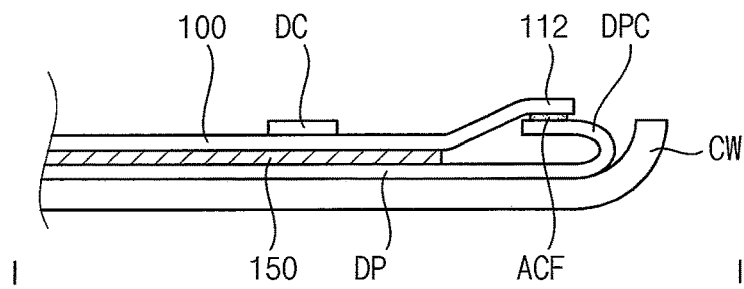
FIGS. 2A and 2B are schematic cross-sectional views taken along line I-I' of the display apparatus of FIG. 1.
Figure 2A:
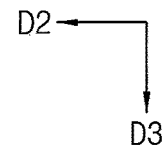
Figure 2B:
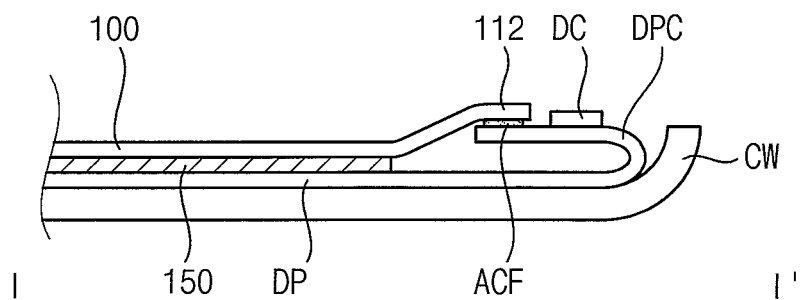
Figure 2B:
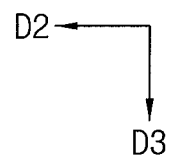
Figure 3:
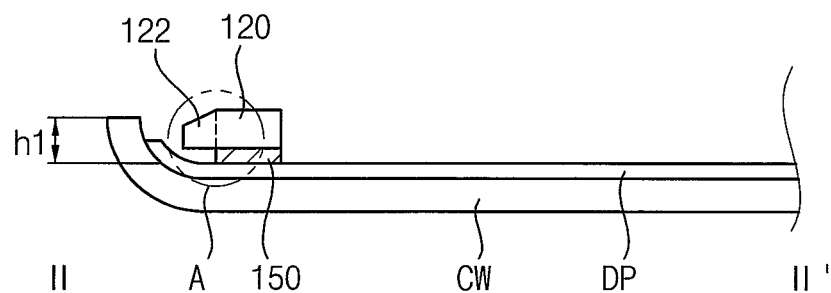
FIG. 3 is a schematic cross-sectional view taken along line II-II' of the display apparatus of FIG. 1.
Figure 3:
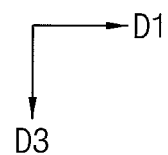
Figure 4A:
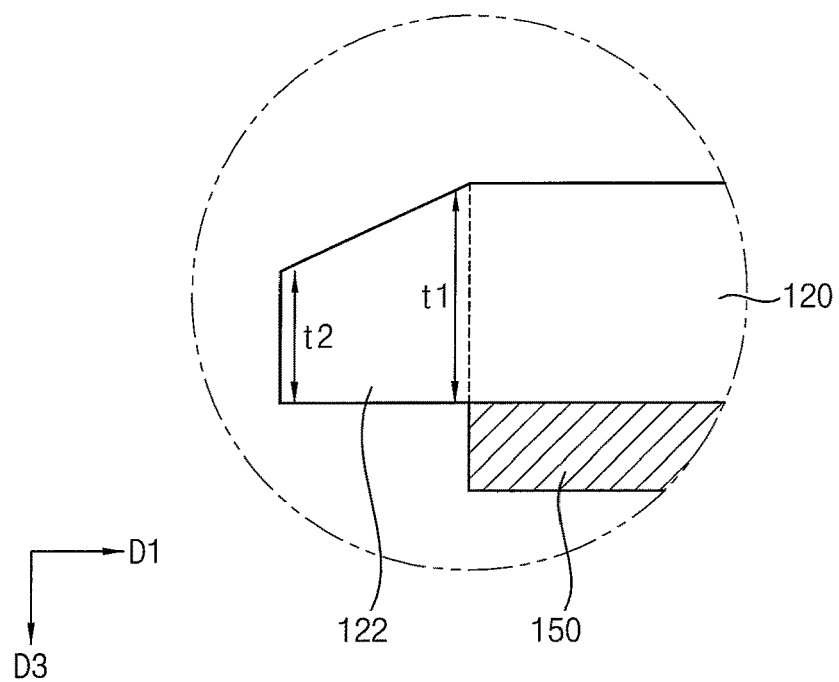
FIG. 4A is an enlarged view showing the 'A' portion or region of the display apparatus of FIG. 3.

FIG. 1 is a perspective view showing a display apparatus according to an embodiment. FIGS. 2A and 2B are schematic cross-sectional views taken along line I-I' of the display apparatus of FIG. 1. FIG. 3 is a schematic cross-sectional view taken along line II-IF of the display apparatus of FIG. 1. FIG. 4A is an enlarged view showing 'A' portion or region of the display apparatus of FIG. 3.

Referring to FIGS. 1 to 4A, a display apparatus may include a display panel DP, a cover window CW, a flexible printed circuit film 100, an adhesive layer 150, and an anisotropic conductive film ACF.

The display panel DP may include a structure in which pixels (not shown) for displaying an image may be disposed on a base substrate. The display panel DP may include a touch electrode (not shown) disposed on the base substrate to recognize a touch input. For example, the display panel DP may include a touch sensing structure formed or disposed on an encapsulation layer that may cover or overlap an organic light emitting element, or may have a structure in which an organic light emitting display panel and a touch screen panel may be stacked. The display panel DP may be disposed in a plan view defined by a first direction D1 and a second direction D2 perpendicular to the first direction D1. A corner of the display panel DP may have a substantially rounded shape to form a substantially curved line. Although not shown in detail, according to an embodiment, the display panel DP may be formed at an edge portion thereof with an edge display area bent in a direction opposite to a third direction D3, which may be substantially perpendicular to the first direction D1 and the second direction D2, to form a substantially curved surface.

The display panel DP may display an image in the third direction D3, and a top surface of the display panel DP shown in the drawing may correspond to a rear surface of the display panel DP. The display panel DP may include an input portion DPC. The input portion DPC may be provided with connection terminals for receiving a driving signal, a power, and the like from an external driving device within the spirit and the scope of the disclosure. The input portion DPC may be disposed in a peripheral area of the display panel DP. According to an embodiment, a part of the input portion DPC may be bent, so that at least a part of the input portion DPC may be disposed on a rear surface of a display portion for displaying an image.

The cover window CW may be disposed on a front surface (a bottom surface in the drawing) of the display panel DP. The cover window CW may be attached to the display panel DP by using an adhesive film (not shown). The cover window CW may have an edge bent in the direction opposite to the third direction D3 to form a substantially curved surface corresponding to the display panel DP. In an electronic device (for example, a smartphone) including the display apparatus, the cover window CW of the display apparatus may constitute a part of an outer surface of the electronic device.

The flexible printed circuit film 100 may include a horizontal portion 110, a vertical portion 120, and a connection portion 130. The flexible printed circuit film 100 may be disposed on the rear surface of the display panel DP to be electrically connected to the display panel DP.

The horizontal portion 110 may extend in the first direction D1. The flexible printed circuit film 100 may include an output portion 112 connected to the horizontal portion 110. The output portion 112 may be bonded to the input portion DPC of the display panel DP. The output portion 112 may extend from the horizontal portion 110, and the output portion 112 may be provided with connection terminals facing the input portion DPC of the display panel DP. The anisotropic conductive film ACF may be disposed between the output portion 112 and the input portion DPC of the display panel DP, so that the display panel DP and the flexible printed circuit film 100 may be electrically connected to each other.

According to an embodiment, as shown in FIG. 2A, the flexible printed circuit film 100 may include a driving unit DC that may generate a driving signal. For example, the driving unit DC may be a driver chip including an integrated circuit for generating the driving signal. For example, the driving signal may include at least a data signal transmitted to a pixel of the display portion.

According to an embodiment, as shown in FIG. 2B, the driving unit DC may be directly coupled or connected to the display panel DP. The driving unit DC coupled or connected to the display panel DP may generate a driving signal according to a control signal transmitted through the flexible printed circuit film 100.

The flexible printed circuit film 100 or the display panel DP may include a protective cover that may cover or overlap the driving unit DC.

Meanwhile, the flexible printed circuit film 100 and the display panel DP may be electrically connected to each other by other electrical connection schemes such as a connector structure and a solder connection structure in addition to the anisotropic conductive film ACF.

The vertical portion 120 may be connected to the horizontal portion 110, and may extend in the second direction D2. A protruding portion 122 may be formed or disposed on the vertical portion 120. The protruding portion 122 may protrude from a side surface of the vertical portion 120. The protruding portion 122 may protrude toward the or an edge of the cover window CW substantially in parallel with the first direction D1.

The protruding portion 122 may be a remaining structure after a stiffener, which will be described below in the descriptions of FIG. 5 and the like, may be cut. Even after the stiffener is cut, the protruding portion 122 may remain in the electronic device including the display apparatus.

The vertical portion 120 of the flexible printed circuit film 100 may have a first thickness t1. An end of the protruding portion 122, which may be adjacent to the edge of the cover window CW, may have a second thickness t2 that may be smaller than the first thickness t1. As shown in FIG. 4A, a section of the protruding portion 122 may have a substantially rectangular or rhombus shape in which a top surface may be inclined.

The connection portion 130 may be connected to the vertical portion 120, and may extend in the first direction D1. The connection portion 130 may be provided with a connector terminal 132. The connection portion 130 may be electrically connected to a driving circuit unit for driving the display panel DP or a peripheral electronic device. After the connection portion 130 may be electrically connected to the driving circuit unit or the peripheral electronic device, the connection portion 130 may be folded to overlap the display panel DP.

The adhesive layer 150 may be disposed between the flexible printed circuit film 100 and the display panel DP, and may be adhered to the flexible printed circuit film 100 and the display panel DP such that the flexible printed circuit film 100 may be located or disposed at a proper or predetermined position on the rear surface of the display panel DP.

Figure 4B:
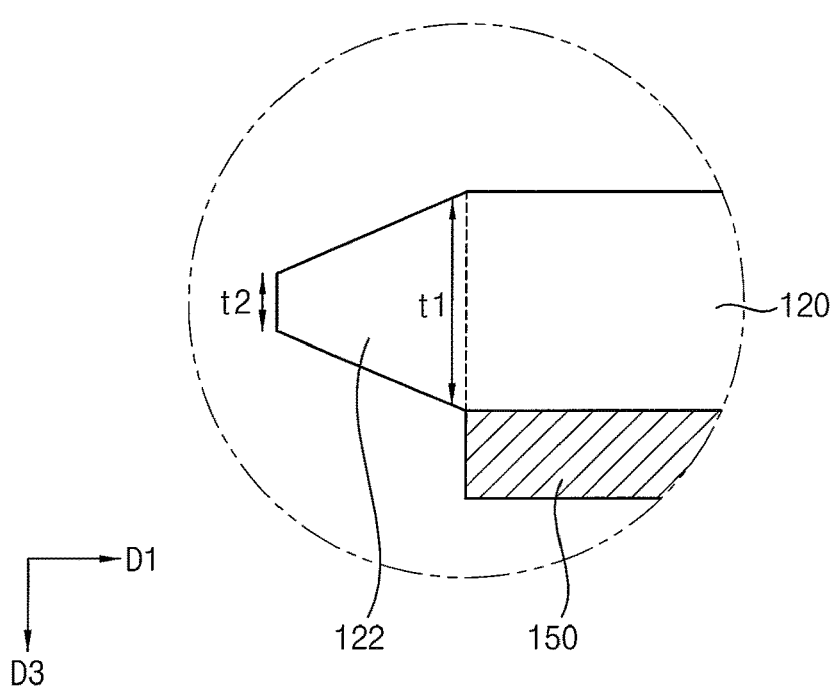
FIG. 4B is an enlarged sectional view showing a protruding portion of a display apparatus according to an embodiment.

FIG. 4B is an enlarged sectional view showing a protruding portion of a display apparatus according to an embodiment.

Referring to FIG. 4B, a display apparatus may be substantially the same as the display apparatus of FIGS. 1 to 4A except for the shape of the protruding portion 122 of the vertical portion 120 of the flexible printed circuit film. Therefore, redundant explanations thereof will be omitted.

The vertical portion 120 of the flexible printed circuit film may have a first thickness t1. An end of the protruding portion 122, which may be adjacent to the or an edge of the cover window CW, may have a second thickness t2 that may be smaller than the first thickness t1. As shown in FIG. 4B, a section of the protruding portion 122 may have a substantially rectangular or triangular or rhombus shape in which top and bottom surfaces may be inclined.

Figure 5:
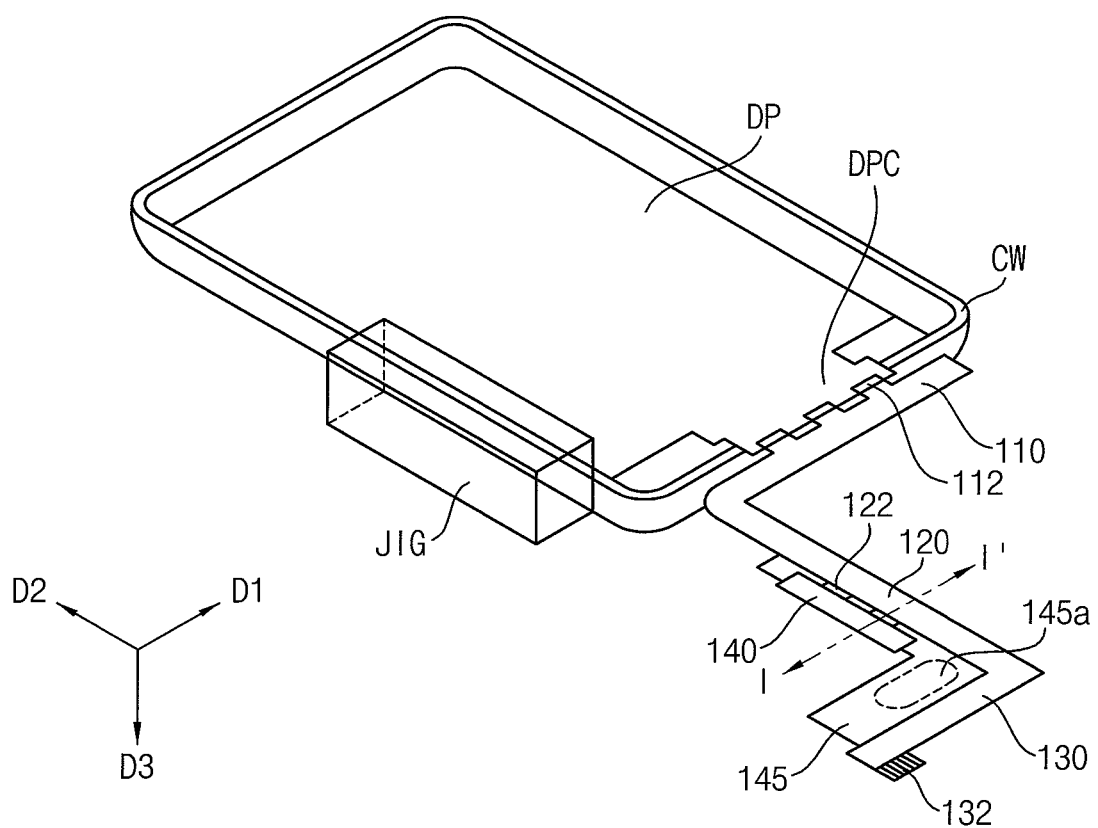
FIG. 5 is a perspective view showing a method of manufacturing a display apparatus according to an embodiment.
Figure 6:
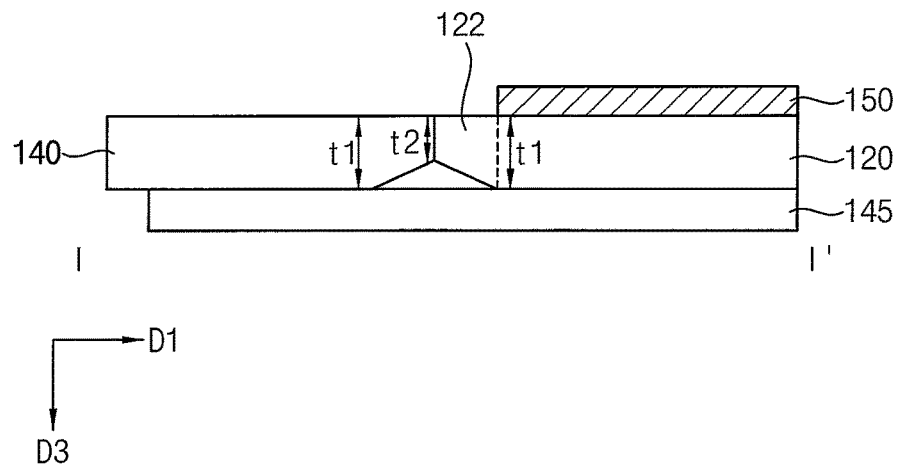
FIG. 6 is a schematic cross-sectional view taken along line I-I' of the display apparatus of FIG. 5.
Figure 7:
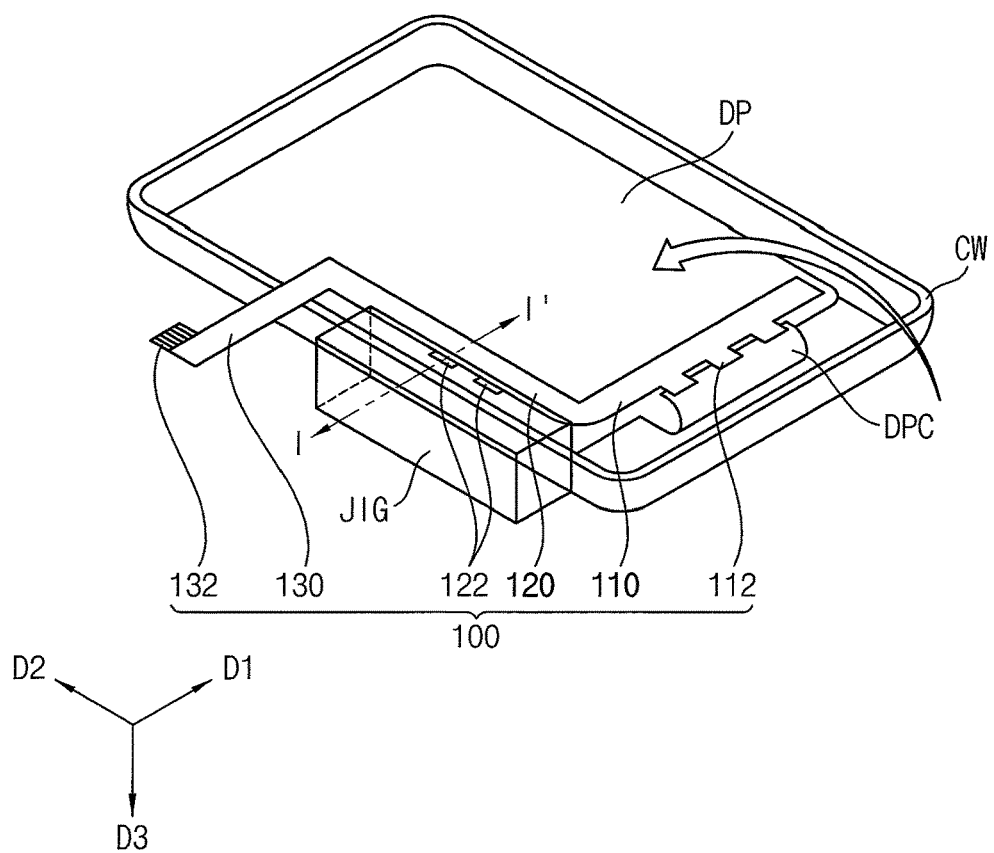
FIG. 7 is a perspective view showing the method of manufacturing the display apparatus.
Figure 8A:
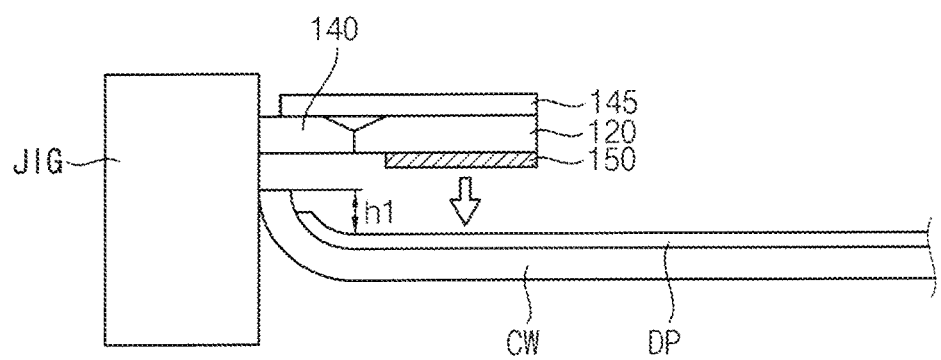
FIGS. 8A and 8B are schematic cross-sectional views taken along line I-I' of the display apparatus of FIG. 7.
Figure 8B:
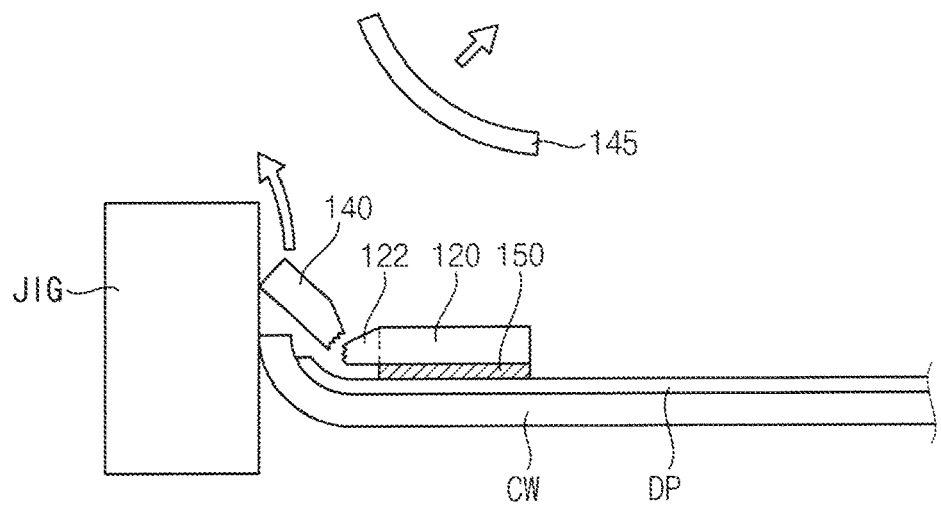

FIG. 5 is a perspective view showing a method of manufacturing a display apparatus according to an embodiment. FIG. 6 is a schematic cross-sectional view taken along line I-I' of the display apparatus of FIG. 5. FIG. 7 is a perspective view showing the method of manufacturing the display apparatus. FIGS. 8A and 8B are schematic cross-sectional views taken along line I-I' of the display apparatus of FIG. 7.

Referring to FIGS. 5 to 8B, a method of manufacturing a display apparatus may include bonding an output portion of a flexible printed circuit film to an input portion of a display panel; attaching the flexible printed circuit film to a rear surface of the display panel by using a jig; and removing a stiffener of the flexible printed circuit film.

Referring to FIGS. 5 and 6, the output portion 112 of the flexible printed circuit film 100 may be bonded to the input portion DPC of the display panel DP.

The display panel DP may include a structure in which pixels (not shown) for displaying an image may be disposed on a base substrate. The display panel DP may include a touch electrode (not shown) disposed on the base substrate to recognize a touch input. A cover window CW may be attached onto a front surface (a bottom surface in the drawing) of the display panel DP.

The flexible printed circuit film 100 may include a horizontal portion 110, a vertical portion 120, and a connection portion 130.

The horizontal portion 110 may extend in a first direction D1. The flexible printed circuit film 100 may include the output portion 112 connected to the horizontal portion 110. The vertical portion 120 may be connected to the horizontal portion 110, and may extend in a second direction D2 perpendicular to the first direction D1. The connection portion 130 may be connected to the vertical portion 120, and may extend in the first direction D1. The connection portion 130 may be provided with a connector terminal 132.

For example, an anisotropic conductive film (see ACF in FIGS. 2A and 2B) may be disposed and pressed between the output portion 112 of the flexible printed circuit film 100 and the input portion DPC of the display panel DP, so that the output portion 112 of the flexible printed circuit film 100 may be bonded to the input portion DPC of the display panel DP. Accordingly, the flexible printed circuit film 100 and the display panel DP may be electrically connected to each other. In this case, as shown in the drawings, while the input portion DPC of the display panel DP is not folded, most of the flexible printed circuit film 100 may not overlap the display panel DP.

The flexible printed circuit film 100 may include a protruding portion 122 and a stiffener 140. The protruding portion 122 may protrude toward an edge of the cover window CW in parallel with the first direction D1. The stiffener 140 may be connected to the vertical portion 120 by the protruding portion 122.

The stiffener 140, the protruding portion 122, and the vertical portion 120 may all be formed by using a base film constituting the flexible printed circuit film.

The protruding portion 122 may have a groove extending in the second direction D2. Accordingly, in the removing of the stiffener of the flexible printed circuit film, which will be described below, the stiffener 140 may be easily removed. In other words, the stiffener 140 and the vertical portion 120 may have a first thickness t1, and an end of the protruding portion 122 may have a second thickness t2 that may be smaller than the first thickness t1.

A cover film 145 coupled or connected to the flexible printed circuit film 100 may be used for an operation of the flexible printed circuit film 100. The cover film 145 may be disposed under or below the flexible printed circuit film 100 (in a third direction D3) in the drawings, and may be detachably attached to the flexible printed circuit film 100 by an adhesive within the spirit and the scope of the disclosure. The cover film 145 may include a handle portion 145a spaced apart from the flexible printed circuit film 100. A worker or machine or device may easily handle the flexible printed circuit film 100 having a relatively small size by using the handle portion 145a.

An adhesive layer 150 may be disposed on the flexible printed circuit film 100. The adhesive layer 150 may be disposed on an opposite surface of a surface where the cover film 145 may be located or disposed, that is, on the flexible printed circuit film 100 in the drawings.

For example, the flexible printed circuit film 100 may be provided with a release paper (not shown) being attached onto the stiffener 140, the cover film 145, and the adhesive layer 150, and the release paper may be detached after the flexible printed circuit film 100 is bonded to the display panel DP by using the anisotropic conductive film ACF, so that the attaching of the flexible printed circuit film to the rear surface of the display panel by using the jig, which will be described below, may be prepared.

Referring to FIGS. 7 and 8A, in the attaching of the flexible printed circuit film to the rear surface of the display panel by using the jig JIG, the flexible printed circuit film 100 may be rotated about an axis extending in the first direction D1 based on the output portion 112, so that the flexible printed circuit film 100 may be located or disposed on the rear surface of the display panel DP. Next, the flexible printed circuit film 100 may be pressed to attach the adhesive layer 150, which may be disposed on the flexible printed circuit film 100, to the display panel DP.

In this case, an attachment position of the flexible printed circuit film 100 may be determined by using a jig JIG that makes contact with the or an edge of the cover window CW of the display apparatus. In detail, the display apparatus may be located or disposed such that the edge of the cover window CW makes contact with the jig JIG. In a case that the flexible printed circuit film 100 may be located or disposed on the rear surface of the display panel DP, a side surface of the stiffener 140 of the flexible printed circuit film 100 may make contact with a side surface of the jig JIG. Accordingly, the vertical portion 120 may be attached while being spaced apart from the or an edge of the cover window CW by an appropriate distance.

Referring to FIG. 8B, in the removing of the stiffener of the flexible printed circuit film, the stiffener 140 may be removed from the vertical portion 120.

The edge of the cover window CW may be higher than the rear surface of the display panel DP by a predetermined distance (see hl in FIG. 8A). As the adhesive layer 150 may be attached onto the display panel DP, a force may be applied to the stiffener 140 so that the stiffener 140 may be inclined with respect to the vertical portion 120 by the or an edge of the cover window CW. Accordingly, the stiffener 140 may be separated from the vertical portion 120. Thereafter, the cover film 145 may be removed.

In a conventional method, an alignment mark may be used in attaching of the flexible printed circuit film onto the rear surface of the display panel. However, as a width of the flexible printed circuit film becomes narrow and a length of the flexible printed circuit film becomes longer, an alignment error may occur, and especially, errors may be accumulated in the second direction D2 so that misalignment in the connection portion 130 may be increased.

In manufacturing of an electronic device including the display apparatus, in a case that the cover window and a storage container are assembled with each other, interference may occur due to the misalignment of the flexible printed circuit film.

According to an embodiment, the attachment position of the flexible printed circuit film 100 may be easily aligned by the worker or machine or device by using the stiffener 140 and the jig JIG. Accordingly, assembly quality may be prevented from deteriorating due to the misalignment, and manufacturing efficiency may be improved.

Figure 9:
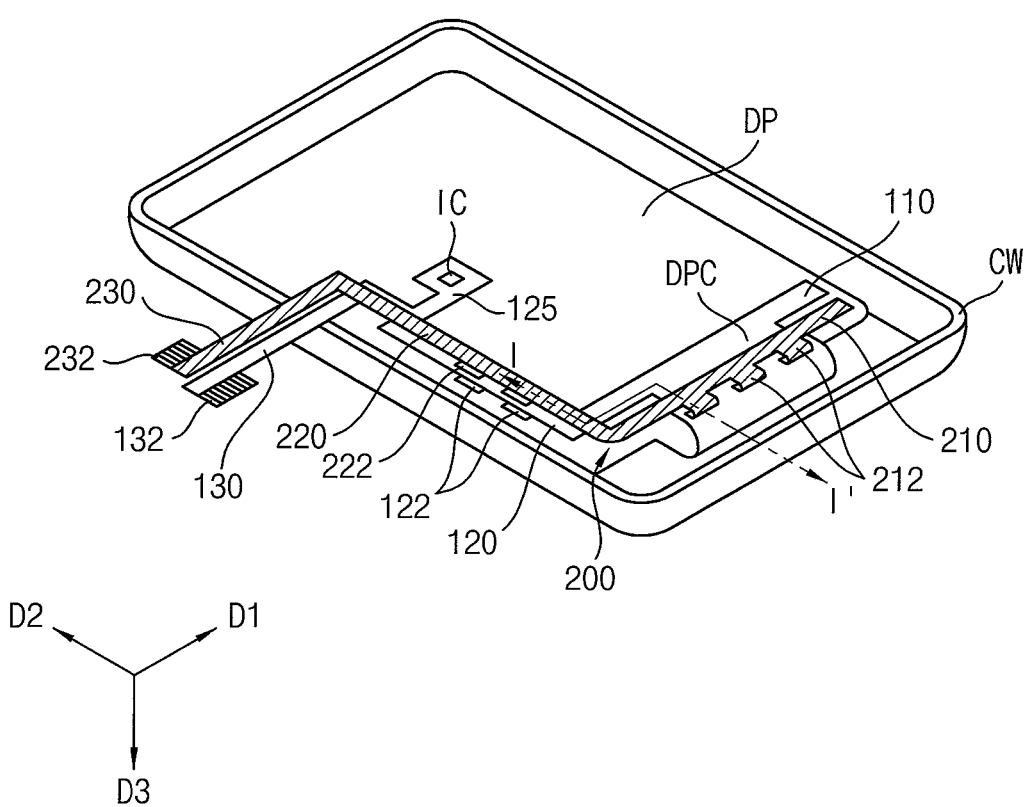
FIG. 9 is a perspective view showing a display apparatus according to an embodiment.
Figure 10A:
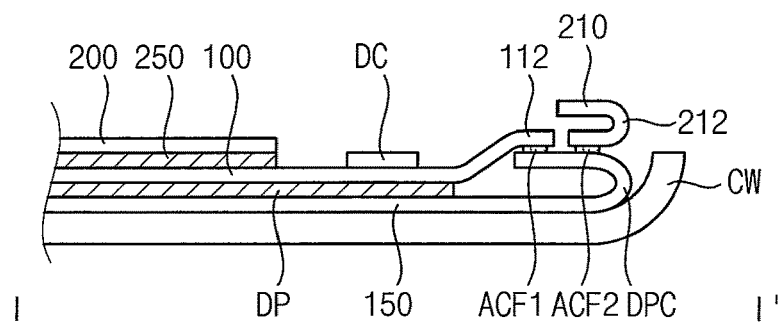
FIGS. 10A and 10B are schematic cross-sectional views taken along line I-I' of the display apparatus of FIG. 9.
Figure 10A:
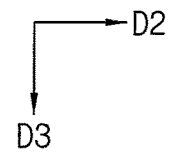
Figure 10B:
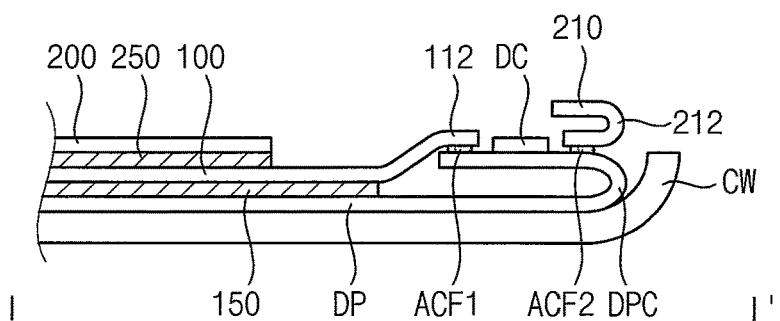
Figure 10B:
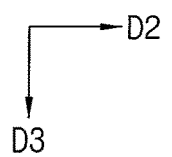

FIG. 9 is a perspective view showing a display apparatus according to an embodiment. FIGS. 10A and 10B are schematic cross-sectional views taken along line I-I' of the display apparatus of FIG. 9.

Referring to FIGS. 9, 10A, and 10B, a display apparatus may be substantially the same as the display apparatus of FIG. 1 except that the display apparatus may include a first flexible printed circuit film 100 and a second flexible printed circuit film 200. Therefore, redundant explanations thereof will be omitted.

The display apparatus may include a display panel DP, a cover window CW, a first flexible printed circuit film 100, a first adhesive layer 150, a second flexible printed circuit film 200, a second adhesive layer 250, and an anisotropic conductive film ACF.

The first flexible printed circuit film 100 may include a first horizontal portion 110, a first vertical portion 120, an IC chip portion 125 on which an IC chip IC is mounted, and a connection portion 130.

According to an embodiment, as shown in FIG. 10A, the first flexible printed circuit film 100 may include a driving unit DC that may generate a driving signal transmitted to the display panel DP. However, embodiments are not limited to the above configuration, and the driving unit DC may be directly coupled or connected to the display panel DP as shown in FIG. 10B.

The first horizontal portion 110 may be electrically connected to the display panel DP, and may extend in a first direction D1. The output portion 112 may be electrically connected to the first horizontal portion 110, and the first flexible printed circuit film 100 may be electrically connected to the display panel DP through the output portion 112 and an anisotropic conductive film ACF1.

The first vertical portion 120 may be connected to the first horizontal portion 110, and may extend in a second direction D2 intersecting the first direction D1.

The IC chip IC may be mounted on the IC chip portion 125, and the IC chip portion 125 may extend from the first vertical portion 120. For example, the IC chip IC may generate a driving signal, a control signal, a power, and the like transmitted to the display panel DP or the driving unit DC.

The first connection portion 130 may be connected to the first vertical portion 120, and may be provided with a connector terminal 132.

The first flexible printed circuit film 100 may be attached onto the display panel DP by the first adhesive layer 150.

The second flexible printed circuit film 200 may include a second horizontal portion 210, a second vertical portion 220, and a second connection portion 230.

The second horizontal portion 210 may be electrically connected to the display panel DP, and may extend in the first direction D1. A folding portion 212 may be connected to the second horizontal portion 210, and the second flexible printed circuit film 200 may be electrically connected to the display panel DP through the folding portion 212 and an anisotropic conductive film ACF2. However, embodiments are not limited to the above configuration. For example, the folding portion 212 may be bonded to the display panel DP by an adhesive member having no conductivity, and the second flexible printed circuit film 200 may be electrically connected to the display panel DP through a connection terminal formed or disposed on the second horizontal portion 210.

The second vertical portion 220 may be connected to the second horizontal portion 210, and may extend in the second direction D2.

The second connection portion 230 may be connected to the second vertical portion 220, and may be provided with a connector terminal 232.

At least a part of the second flexible printed circuit film 200 may be attached to the first flexible printed circuit film 100 by the second adhesive layer 250. However, embodiments are not limited to the above configuration. For example, at least a part of the second adhesive layer 250 may be attached onto the display panel DP.

Protruding portions 122 and 222 may be formed or disposed on a side surface of the first vertical portion 120 of the first flexible printed circuit film 100 and a side surface of the second vertical portion 220 of the second flexible printed circuit film 200, respectively.

In this case, the first flexible printed circuit film 100 may be electrically connected to a pixel included in the display panel DP to display an image. For example, the driving unit DC may generate a driving signal such as a data signal for displaying an image on the display panel DP. The first flexible printed circuit film 100 may transmit the driving signal to the display panel DP, or may transmit a control signal for generating the driving signal to the driving unit DC coupled or connected to the display panel DP. The first flexible printed circuit film 100 may transmit a power supply voltage to the display panel DP.

The second flexible printed circuit film 200 may be electrically connected to a touch electrode included in the display panel DP to detect a touch input.

Figure 11:
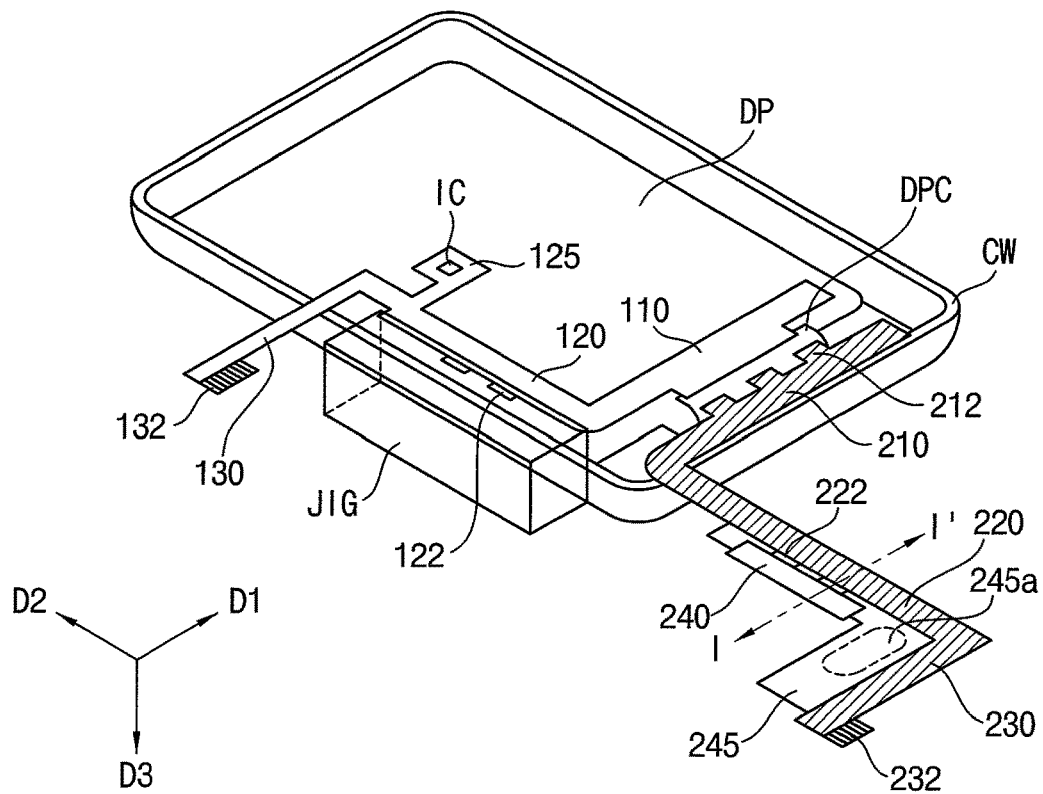
FIG. 11 is a perspective view showing a method of manufacturing a display apparatus according to an embodiment.
Figure 12:
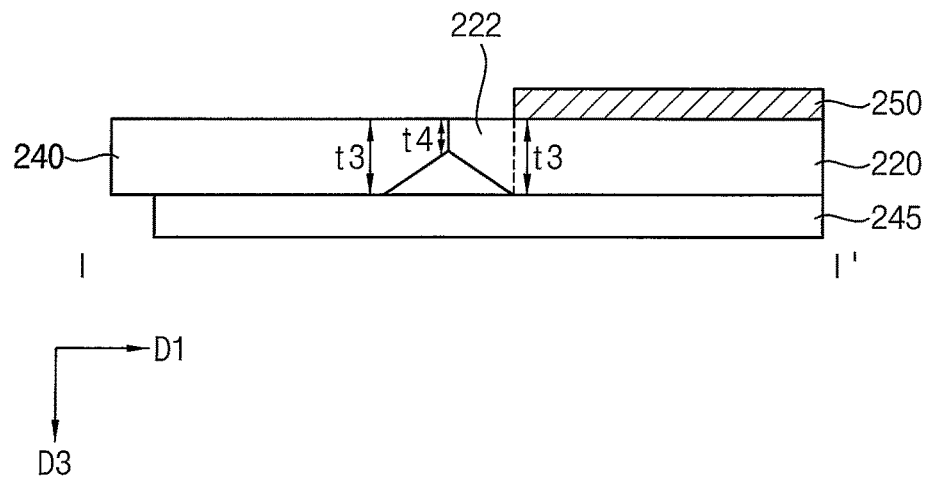
FIG. 12 is a schematic cross-sectional view taken along line I-I' of the display apparatus of FIG. 11.
Figure 13:
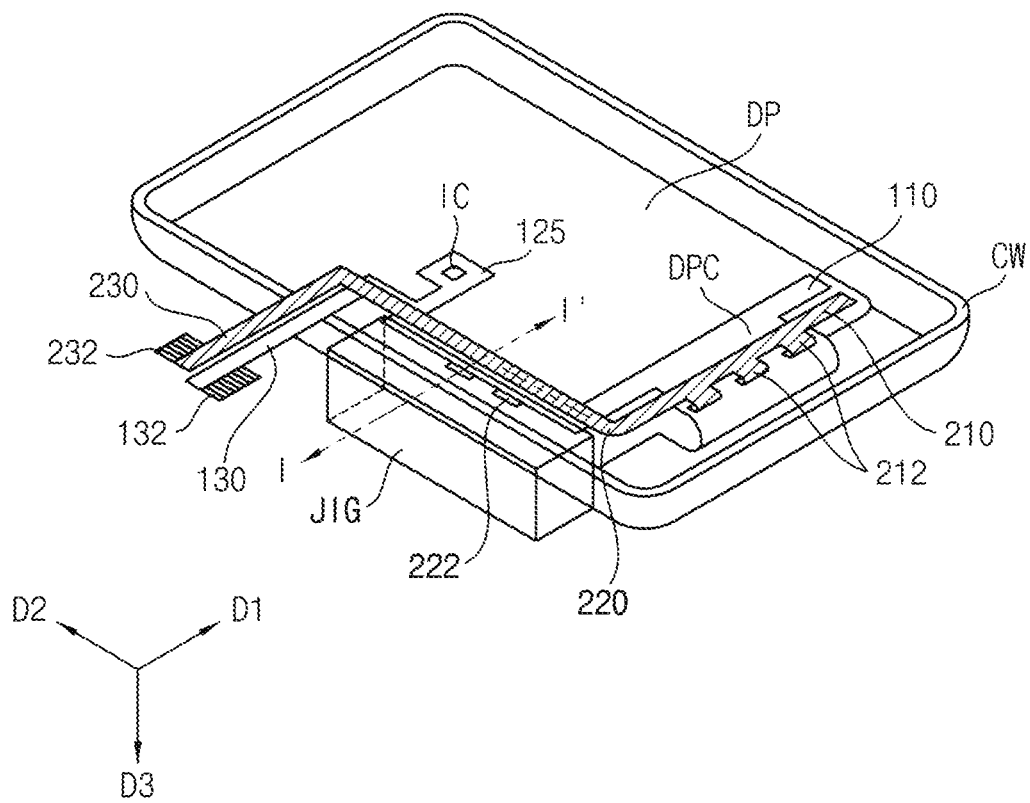
FIG. 13 is a perspective view showing the method of manufacturing the display apparatus.
Figure 14A:
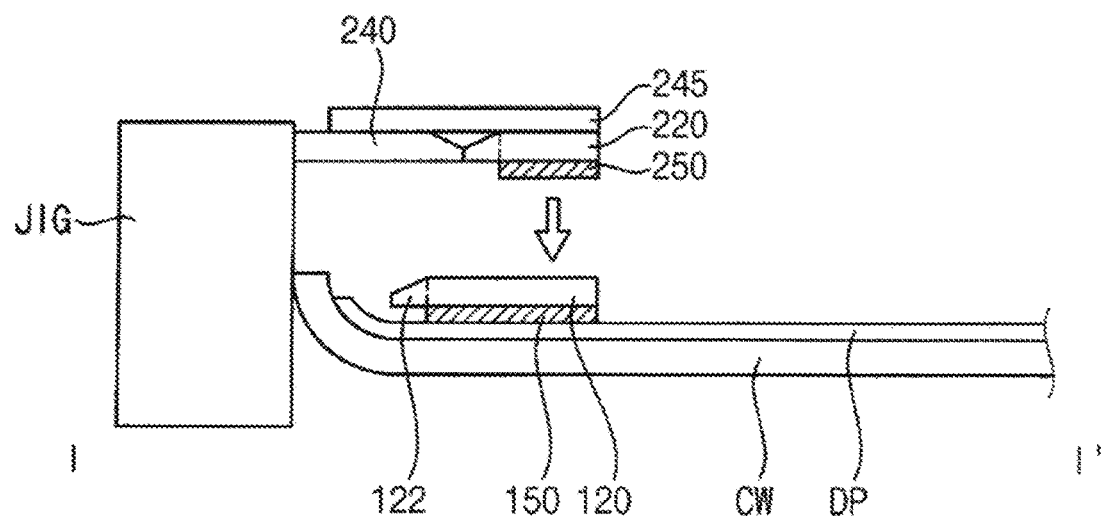
FIGS. 14A and 14B are schematic cross-sectional views taken along line I-I' of the display apparatus of FIG. 13.
Figure 14B:
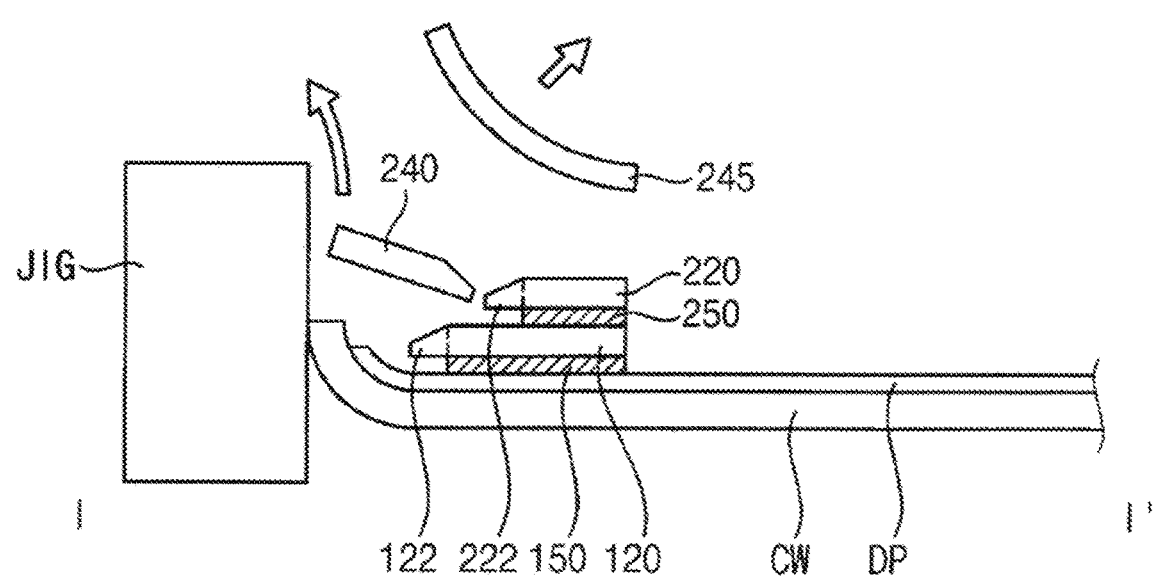

FIG. 11 is a perspective view showing a method of manufacturing a display apparatus according to an embodiment. FIG. 12 is a schematic cross-sectional view taken along line I-I' of the display apparatus of FIG. 11. FIG. 13 is a perspective view showing the method of manufacturing the display apparatus. FIGS. 14A and 14B are schematic cross-sectional views taken along line I-I' of the display apparatus of FIG. 13.

Referring to FIGS. 11 to 14B, a method of manufacturing a display apparatus may include attaching a first flexible printed circuit film 100, which may include a first horizontal portion 110, a first vertical portion 120, and a first stiffener 140, onto a rear surface of a display panel DP. The attaching of the first flexible printed circuit film 100 onto the rear surface of the display panel DP may be substantially the same as the attaching step described with reference to FIGS. 5 to 8B. Therefore, redundant explanations thereof will be omitted.

The method of manufacturing the display apparatus may include partially bonding a second flexible printed circuit film 200, which may include a second horizontal portion 210 extending in the first direction D1, a second vertical portion 220 connected to the second horizontal portion 210 and extending in the second direction D2, and a second stiffener 240 connected to the second vertical portion 220, to the display panel DP; positioning a side surface of the second stiffener 240 such that the or a side surface of the second stiffener 240 may make contact with the jig JIG, and bending the second flexible printed circuit film 200; and removing the second stiffener 240 of the second flexible printed circuit film 200.

According to an embodiment, an end of the second flexible printed circuit film 200 may be bonded to the display panel DP. For example, the end of the second flexible printed circuit film 200 may be bonded to the input portion DPC of the display panel DP.

Next, the second flexible printed circuit film 200 may be folded about an axis extending in the first direction D1. Accordingly, the second adhesive layer 250 coupled or connected to the second flexible printed circuit film 200 may be attached to the rear surface of the display panel DP or the first flexible printed circuit film 100. Therefore, the second flexible printed circuit film 200 may be coupled or connected to the display panel DP. As the second flexible printed circuit film 200 may be partially bent, the folding portion 212 of the second flexible printed circuit film 200 may be formed. According to an embodiment, at least a part or a portion of the second flexible printed circuit film 200 may be attached to the first flexible printed circuit film 100.

In this case, the same jig may be used in a step of bending the first flexible printed circuit film 100 and the bending of the second flexible printed circuit film 200.

For example, a second cover film 245 coupled or connected to the second flexible printed circuit film 200 may be used for an operation of the second flexible printed circuit film 200. The second cover film 245 may include a handle portion 245a spaced apart from the second flexible printed circuit film 200. The worker or machine or device may easily handle the second flexible printed circuit film 200 having a relatively small size by using the handle portion 245a.

After the second flexible printed circuit film 200 is bonded to the rear surface of the display panel DP or the first flexible printed circuit film 100, the second cover film 245 and the second stiffener 240 may be removed.

As illustrated in FIG. 12, the second vertical portion 220 of the flexible printed circuit film 100 may have a thickness t3. An end of the protruding portion 222 may have a thickness t4 that may be smaller than the thickness t3. As shown in FIG. 12, a section of the protruding portion 222 may have a substantially triangular shape in which side surfaces may be inclined.

A process of coupling the second flexible printed circuit film 200 to the display panel DP may be similar to the process shown in FIGS. 5 to 8B, so that redundant explanations thereof will be omitted.

According to an embodiment, the first stiffener 140 of the first flexible printed circuit film 100 and the second stiffener 240 of the second flexible printed circuit film 200 may have different widths in the first direction D1.

Figure 15:
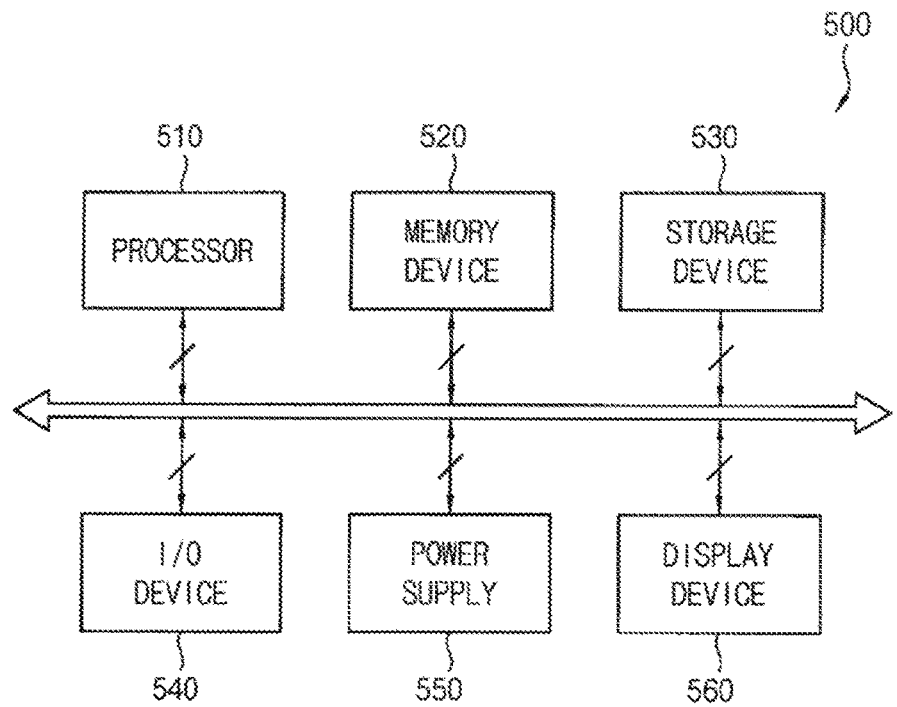
FIG. 15 is a block diagram showing an electronic device according to an embodiment.

FIG. 15 is a block diagram showing an electronic device according to embodiments.

Referring to FIG. 15, an electronic device 500 may include a processor 510, a memory device 520, a storage device 530, an input/output (I/O) device 540, a power supply 550, and a display device 560. For example, the display device 560 may correspond to the display apparatus shown in FIG. 1 or FIG. 9. The electronic device 500 may include various ports for communicating with a video card, a sound card, a memory card, a USB device, and the like, or communicating with other systems. In an embodiment, for example, the electronic device 500 may be implemented as a television. In an embodiment, the electronic device 500 may be implemented as a smartphone. However, the above embodiments are provided for illustrative purposes, and the electronic device 500 is not limited to the above embodiments. For example, the electronic device 500 may also be implemented as a mobile phone, a video phone, a smart pad, a smart watch, a tablet PC, a vehicle navigation system, a computer monitor, a laptop computer, a head-mounted display (HMD), within the spirit and the scope of the disclosure.

The processor 510 may perform predetermined calculations or tasks. In an embodiment, the processor 510 may be a microprocessor, a central processing unit (CPU), an application processor (AP), within the spirit and the scope of the disclosure. The processor 510 may be electrically connected to other components through an address bus, a control bus, a data bus, within the spirit and the scope of the disclosure. In an embodiment, the processor 510 may also be electrically connected to an expansion bus such as a peripheral component interconnect (PCI) bus. The memory device 520 may store data required for operations of the electronic device 500. For example, the memory device 520 may include: a nonvolatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano-floating gate memory (NFGM) device, a polymer random access memory (PoRAM) device, a magnetic random access memory (MRAM) device, and a ferroelectric random access memory (FRAM) device; and/or a volatile memory device such as a dynamic random access memory (DRAM) device, a static random access memory (SRAM) device, and a mobile DRAM device. The storage device 530 may include a solid state drive (SSD), a hard disk drive (HDD), a CD-ROM, within the spirit and the scope of the disclosure. The I/O device 540 may include: an input device such as a keyboard, a keypad, a touch pad, a touch screen, and a mouse; and an output device such as a speaker and a printer. The power supply 550 may supply a power required for the operations of the electronic device 500. However, the disclosure is not limited thereto.

The display device 560 may be electrically connected to other components through the buses or other communication links. In an embodiment, the display device 560 may be included in the I/O device 540.

As described above, since the display device 560 may attach the flexible printed circuit film at a proper position by using the stiffener and the jig, an electronic device including the display device with improved assembly quality may be provided. However, since the above configuration has been described above, redundant explanations thereof will be omitted.

Figure 16:
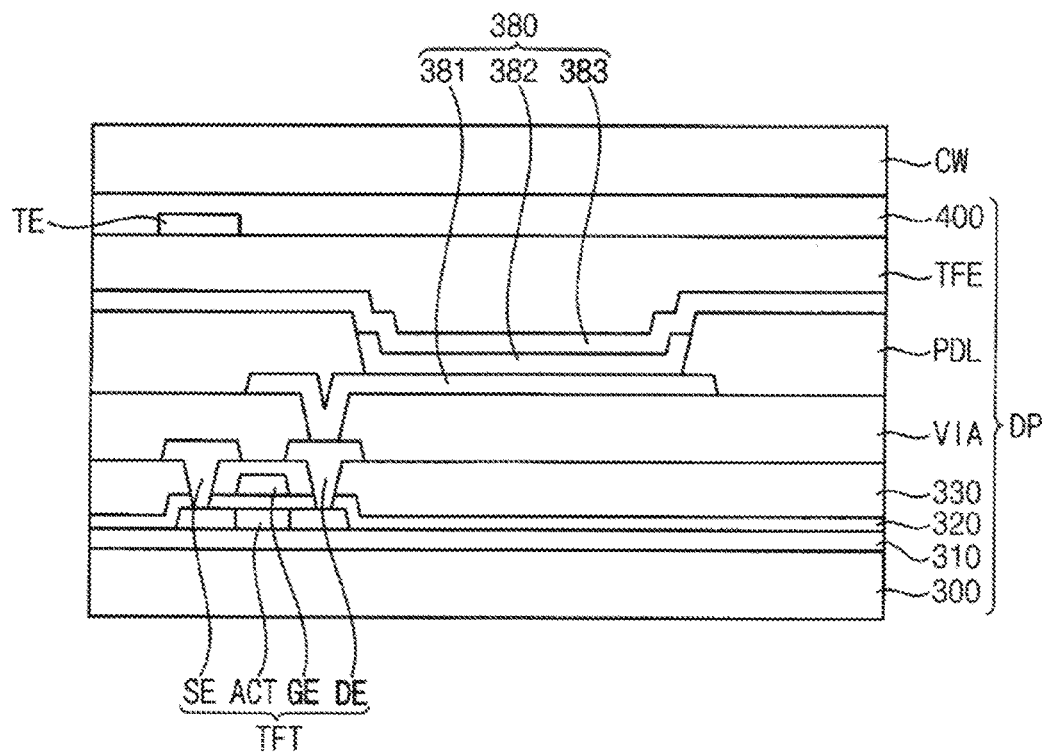
FIG. 16 is a schematic cross-sectional view showing a display panel of a display apparatus according to an embodiment.

FIG. 16 is a schematic cross-sectional view showing a display panel of a display apparatus according to an embodiment.

Referring to FIG. 16, the display panel DP of the display apparatus may include a substrate 300, a buffer layer 310, a thin film transistor TFT, a first insulating layer 320, a second insulating layer 330, a via insulating layer VIA, a pixel defining layer PDL, a light emitting structure 380, a thin film encapsulation layer TFE, and the within the spirit and the scope of the disclosure. The thin film transistor TFT may include an active pattern ACT, a gate electrode GE, a source electrode SE, and a drain electrode DE. The light emitting structure 380 may include a first electrode 381, a light emitting layer 382, and a second electrode 383. The display panel DP may include a touch layer disposed on the thin film encapsulation layer TFE. A cover window CW may be disposed on the touch layer. The touch layer may include a touch electrode TE and an insulating layer 400.

The substrate 300 may include a transparent or opaque material. The substrate 300 may be a transparent resin substrate. Examples of the transparent resin substrate that may be used as the substrate 300 include a polyimide substrate. In an embodiment, the substrate 300 may include a quartz substrate, a synthetic quartz substrate, a calcium fluoride substrate, a fluorine-doped quartz substrate (F-doped quartz substrate), a soda lime glass substrate, a non-alkali glass substrates, within the spirit and the scope of the disclosure.

The buffer layer 310 may prevent metal atoms or impurities from diffusing from the substrate 300 to the thin film transistor TFT, and may control a heat transfer rate during a crystallization process for forming the active pattern ACT to obtain a substantially uniform active pattern ACT. In a case that a surface of the substrate 300 is not uniform, the buffer layer may serve to improve flatness of the surface of the substrate 300. Depending on a type of the substrate 300, at least two buffer layers may be provided or disposed on the substrate 300, or the buffer layer may not be provided. For example, the buffer layer 310 may include an organic material or an inorganic material.

The active pattern ACT may be disposed on the buffer layer 310. The active pattern ACT may include a metal oxide semiconductor, an inorganic semiconductor (for example, an amorphous silicon semiconductor or a poly silicon semiconductor), an organic semiconductor, within the spirit and the scope of the disclosure. The active pattern ACT may have a source region, a drain region, and a channel region disposed between the source region and the drain region.

The first insulating layer 320 may be disposed on the active pattern ACT. For example, the first insulating layer 320 may sufficiently cover or overlap the active pattern ACT on the substrate 300, and may have a substantially flat top surface without creating a step around the active pattern ACT. In an embodiment, the first insulating layer 320 may be disposed along a profile of the active pattern ACT with a uniform thickness to cover or overlap the active pattern ACT on the substrate 300. The first insulating layer 320 may include a silicon compound, metal oxide, within the spirit and the scope of the disclosure. In an embodiment, the first insulating layer 320 may have a multilayer structure including insulating layers. For example, the insulating layers may have mutually different thicknesses or may include mutually different materials.

A gate pattern including the gate electrode GE may be disposed on the first insulating layer 320. The gate pattern may overlap the channel region of the active pattern ACT. The gate electrode GE may include a metal, an alloy, metal nitride, conductive metal oxide, a transparent conductive material, within the spirit and the scope of the disclosure. In an embodiment, the gate pattern may include a multilayer structure including metal layers. For example, the metal layers may have mutually different thicknesses or may include mutually different materials.

The second insulating layer 330 may be disposed on the gate pattern. For example, the second insulating layer 330 may sufficiently cover or overlap the gate pattern on the first insulating layer 320, and may have a substantially flat top surface without creating a step around the gate pattern. In an embodiment, the second insulating layer 330 may be disposed along a profile of the gate pattern with a uniform thickness to cover or overlap the gate pattern on the first insulating layer 320. The second insulating layer 330 may include a silicon compound, metal oxide, within the spirit and the scope of the disclosure. In an embodiment, the second insulating layer 330 may have a multilayer structure including insulating layers. For example, the insulating layers may have mutually different thicknesses or may include mutually different materials.

A data pattern including the source electrode SE and the drain electrode DE of the thin film transistor TFT may be disposed on the second insulating layer 330. The source electrode SE may be electrically connected to the source region of the active pattern ACT through a contact hole formed by removing first portions of the first insulating layer 320 and the second insulating layer 330, and the drain electrode DE may be electrically connected to the drain region of the active pattern ACT through a contact hole formed by removing second portions of the first insulating layer 320 and the second insulating layer 330. Each of data patterns may include a metal, an alloy, metal nitride, conductive metal oxide, a transparent conductive material, within the spirit and the scope of the disclosure. These may be used alone or in combination with each other. In an embodiment, the data pattern may have a multilayer structure including metal layers. For example, the metal layers may have mutually different thicknesses or may include mutually different materials.

Accordingly, thin film transistor TFT including the active pattern ACT, the first insulating layer 320, the gate electrode GE, the second insulating layer 330, the source electrode SE, and the drain electrode DE may be provided.

Although the thin film transistor TFT has been described as having a top gate structure, configuration of embodiments is not limited thereto. For example, the thin film transistor TFT may have a bottom gate structure, a double gate structure, within the spirit and the scope of the disclosure.

The via insulating layer VIA may be disposed on the second insulating layer 330 and the data pattern. For example, the via insulating layer VIA may have a relatively thick thickness. In this case, the via insulating layer VIA may have a substantially flat top surface. In order to implement such a flat top surface of the via insulating layer VIA, a planarization process may be additionally performed on the via insulating layer VIA. In an embodiment, the via insulating layer VIA may be disposed along a profile of the data pattern with a uniform thickness on the second insulating layer 330. The via insulating layer VIA may be formed of an organic material or an inorganic material. In embodiments, the via insulating layer VIA may include an organic material.

The first electrode 381 may be disposed on the via insulating layer VIA. The first electrode 381 may be electrically connected to the thin film transistor TFT through a contact hole formed by removing a part of the via insulating layer VIA. The first electrode 381 may include a metal, an alloy, metal nitride, conductive metal oxide, a transparent conductive material, within the spirit and the scope of the disclosure. These may be used alone or in combination with each other. In an embodiment, the first electrode 381 may have a multilayer structure including metal layers. For example, the metal layers may have mutually different thicknesses or may include mutually different materials.

The pixel defining layer PDL may be disposed on the via insulating layer VIA. For example, the pixel defining layer PDL may expose a part of a top surface of the first electrode 381 while covering or overlapping both sides of the first electrode 381. The pixel defining layer PDL may be formed of an organic material or an inorganic material. In the embodiments, the pixel defining layer PDL may include an organic material.

The light emitting layer 382 may be disposed on the pixel defining layer PDL and the first electrode 381. The light emitting layer 382 may be formed by using at least one of light emitting materials for emitting different color lights (for example, red light, green light, blue light, or other light) according to sub-pixels. Alternatively, the light emitting layer 382 may be formed by stacking light emitting materials for generating different color lights such as red light, green light, and blue light to emit white light as a whole. In this case, a color filter may be disposed on the light emitting layer 382 that may be disposed on the first electrode 381. The color filter may include at least one of a red color filter, a green color filter, and a blue color filter. In an embodiment, the color filter may include a yellow color filter, a cyan color filter, and a magenta color filter. The color filter may include a photosensitive resin or a color photoresist.

The second electrode 383 may be disposed on the light emitting layer 382 and the pixel defining layer PDL. The second electrode 383 may include a metal, an alloy, metal nitride, conductive metal oxide, a transparent conductive material, within the spirit and the scope of the disclosure. These may be used alone or in combination with each other. In an embodiment, the second electrode 383 may have a multilayer structure including metal layers. For example, the metal layers may have mutually different thicknesses or may include mutually different materials. The light emitting structure 380 may correspond to a display layer for displaying an image.

The thin film encapsulation layer TFE may be disposed on the second electrode 383. The thin film encapsulation layer TFE may include at least one inorganic layer and at least one organic layer that may be alternately stacked on each other. For example, the thin film encapsulation layer TFE may include a first inorganic layer, an organic layer disposed on the first inorganic layer, and a second inorganic layer disposed on the organic layer. The thin film encapsulation layer TFE may prevent the light emitting layer 382 from deteriorating due to penetration of moisture, oxygen, within the spirit and the scope of the disclosure. The thin film encapsulation layer TFE may perform a function of protecting the display panel DP from an external impact. The thin film encapsulation layer TFE may improve flatness of the display panel DP.

The touch electrode TE may be disposed on the thin film encapsulation layer TFE. The touch electrode TE may detect a touch input of a user. The insulating layer 400 may be disposed on the touch electrode TE. The cover window CW may be disposed on the insulating layer 400.

Embodiments may be applied to a display apparatus and various electronic devices including the display apparatus. For example, embodiments may be applied to a mobile phone, a smart phone, a video phone, a smart watch, a table PC, a navigator for a vehicle, a television, a computer monitor, a notebook computer, a head-mount display within the spirit and the scope of the disclosure.

The foregoing is illustrative of embodiments and is not to be construed as limiting thereof. Although embodiments have been described, those skilled in the art will readily appreciate that many modifications are possible in the embodiments without materially departing from the novel teachings and aspects of the disclosure. Accordingly, all such modifications are intended to be included within the scope of the disclosure. Therefore, it is to be understood that the foregoing is illustrative of various embodiments and is not to be construed as limited to the embodiments disclosed, and that modifications to the disclosed embodiments, as well as other embodiments, are intended to be included within the scope of the disclosure, as set forth in the following claims and equivalents thereof.

What is claimed is:
1. A display apparatus comprising:
a display panel that displays an image and includes a display portion and an input portion extending from the display portion;
a first flexible printed circuit film disposed on a rear surface of the display panel, the first flexible printed circuit film including:
a first horizontal portion extending in a first direction along a first edge of the display panel;
a first vertical portion electrically connected to the first horizontal portion and extending in a second direction intersecting the first direction along a second edge of the display panel, which is perpendicular to the first edge; and an output portion protruding from the first horizontal portion in a direction opposite to the first vertical portion and being bonded to the input portion of the display panel; and a cover window disposed on the display panel, wherein the first flexible printed circuit film includes a protruding portion that protrudes from a side surface of the first vertical portion of the first flexible printed circuit film toward outside of the display panel in the first direction.

2. The display apparatus of claim 1, wherein
the first vertical portion of the first flexible printed circuit film has a first thickness,
the protruding portion has an end which is adjacent to the edge of the cover window and has a second thickness, and
the second thickness is smaller than the first thickness.

3. The display apparatus of claim 1, wherein
the output portion of the first flexible printed circuit film is electrically connected to the input portion of the display panel by an anisotropic conductive film.

4. The display apparatus of claim 1, wherein the first flexible printed circuit film includes a connection portion connected to the first vertical portion and including a connector terminal.

5. The display apparatus of claim 1, further comprising:
an adhesive layer disposed between the first horizontal portion and the display panel.

6. The display apparatus of claim 1, further comprising a second flexible printed circuit film disposed on the rear surface of the display panel, the second flexible printed circuit film including:
a second horizontal portion electrically connected to the display panel and extending in the first direction; and
a second vertical portion connected to the second horizontal portion and extending in the second direction.

7. The display apparatus of claim 6, wherein the second flexible printed circuit film includes a protruding portion that protrudes from a side surface of the second vertical portion.

8. The display apparatus of claim 6, wherein the first flexible printed circuit film at least partially overlaps the second flexible printed circuit film.

9. The display apparatus of claim 8, wherein the second flexible printed circuit film includes a folding portion bonded to the display panel.

10. The display apparatus of claim 1, wherein a length of the first vertical portion of the first flexible printed circuit film is longer than a length of the first horizontal portion of the first flexible printed circuit film.

11. A method of manufacturing a display apparatus, the method comprising:
partially bonding a first flexible printed circuit film to a display panel, the first flexible printed circuit film including a first horizontal portion extending in a first direction, a first vertical portion connected to the first horizontal portion and extending in a second direction, and a first stiffener connected to the first vertical portion;
arranging the first flexible printed circuit film on a rear surface of the display panel such that a side surface of the first stiffener contacts a jig;
adhering the vertical portion of the first flexible printed circuit film to the rear surface of the display panel; and
removing the first stiffener from the vertical portion adhered to the display panel after the vertical portion of the first flexible printed circuit film is adhered to the display panel.

12. The method of claim 11, wherein
the display panel includes a display portion and an input portion extending from the display portion, and
the arranging of the first flexible printed circuit film includes bending the input portion of the display panel.

13. The method of claim 12, wherein the partially boding of the first flexible printed circuit film to the display panel includes electrically connecting the first flexible printed circuit film to the display panel by an anisotropic conductive film.

14. The method of claim 11, further comprising:
attaching a cover film to the first flexible printed circuit film, the cover film includes a handle portion spaced apart from the first flexible printed circuit film; and
removing the cover film after the adhesive layer is adhered to the rear surface of the display panel.

15. The method of claim 11, further comprising:
connecting the first stiffener of the first flexible printed circuit film to the first vertical portion by a protruding portion that protrudes from a side surface of the first vertical portion; and
forming a groove in the protruding portion, the groove extending in the second direction.

16. The method of claim 11, further comprising:
partially bonding a second flexible printed circuit film to the display panel after the first stiffener is removed, the second flexible printed circuit film including a second horizontal portion extending in the first direction, a second vertical portion connected to the second horizontal portion and extending in the second direction, and a second stiffener connected to the second vertical portion;
arranging the second flexible printed circuit film on the rear surface of the display panel such that a side surface of the second stiffener contacts the jig; and
removing the second stiffener of the second flexible printed circuit film.

17. The method of claim 16, wherein
the first stiffener of the first flexible printed circuit film and the second stiffener of the second flexible printed circuit film have different widths in the first direction.

18. The method of claim 16, wherein
the display panel includes a pixel structure that displays an image and a touch electrode,
the partially bonding of the first flexible printed circuit film includes electrically connecting the first flexible printed circuit film to the pixel structure, and
the partially bonding of the second flexible printed circuit film includes electrically connecting the second flexible printed circuit film to the touch electrode.

19. A flexible printed circuit film comprising:
a horizontal portion extending in a first direction;
a vertical portion extending in a second direction intersecting the first direction;
a protruding portion protruding from a side surface of the vertical portion; and
a stiffener continuously connected to the protruding portion and extending on a same plane as the vertical portion, wherein
the stiffener extends in the second direction, and
the stiffener and the protruding portion commonly include a same base film.

20. The flexible printed circuit film of claim 19, wherein the vertical portion is longer than the horizontal portion.

21. The flexible printed circuit film of claim 19, wherein the protruding portion has a groove extending in the second direction.

22. The flexible printed circuit film of claim 19, further comprising a cover film detachably attached onto the vertical portion and the horizontal portion,
  wherein the cover film includes a handle portion spaced apart from the vertical portion and the horizontal portion.

23. The flexible printed circuit film of claim 19, further comprising:
  a connection portion connected to the vertical portion and including a connector terminal.

* * * * *